United States Patent [19]
Otsuki et al.

[11] Patent Number: 6,165,543
[45] Date of Patent: Dec. 26, 2000

[54] METHOD OF MAKING ORGANIC EL DEVICE AND ORGANIC EL TRANSFER BASE PLATE

[75] Inventors: Shigeyoshi Otsuki; Shinichi Fukuzawa, both of Tokyo, Japan

[73] Assignee: NEC Corporation, Tokyo, Japan

[21] Appl. No.: 09/332,224

[22] Filed: Jun. 14, 1999

[30] Foreign Application Priority Data

Jun. 17, 1998 [JP] Japan .................................. 10-170351

[51] Int. Cl.[7] ...................................................... B05D 5/12
[52] U.S. Cl. ........................... 427/66; 427/545; 427/557; 427/256; 427/287; 430/199
[58] Field of Search ............................. 427/66, 545, 557, 427/592, 256, 287; 430/200, 201, 212, 199; 101/492

[56] References Cited

U.S. PATENT DOCUMENTS 5,157,414  10/1992  Seino et al. .............................. 347/207
5,688,551  11/1997  Littman et al. ........................... 427/64

FOREIGN PATENT DOCUMENTS

| | | |
|---|---|---|
| 63-49965 | 4/1988 | Japan . |
| 2-71996 | 5/1990 | Japan . |
| 7-57871 | 3/1995 | Japan . |
| 7-153573 | 6/1995 | Japan . |
| 8-222371 | 8/1996 | Japan . |
| 8-276697 | 10/1996 | Japan . |
| 9-115672 | 5/1997 | Japan . |
| 9-167684 | 6/1997 | Japan . |
| 9-204984 | 8/1997 | Japan . |
| 10-208881 | 8/1998 | Japan . |
| 11-54275 | 2/1999 | Japan . |
| 11-260549 | 9/1999 | Japan . |
| 12-12216 | 1/2000 | Japan . |

*Primary Examiner*—Shrive Beck
*Assistant Examiner*—Michael Cleveland

[57] ABSTRACT

A method of making an organic EL device which enable production of a color system having image quality in a large display screen. The method of making the organic EL devices includes the steps of, arranging an organic EL transfer base plate obtained by depositing a luminescent organic compound on one side of a heat resistant base film and a transparent substrate provided with at least a transparent electrode leaving a space therebetween, and transferring by sublimation said luminescent organic compound on said transparent substrate by locally heating the heat resistant base film of said organic EL transfer base plate.

4 Claims, 4 Drawing Sheets

METHOD OF MAKING ORGANIC EL DEVICE AND ORGANIC EL TRANSFER BASE PLATE

BACKGROUND OF THE INVENTION

Field of the Invention

This invention relates to a method of manufacturing organic EL devices and also relates to a method of manufacturing organic EL transfer base plates.

BACKGROUND ART

Organic EL devices (organic Electro-Luminescent devices) are constructed such that an organic EL layer made of an organic luminescent compound is sandwiched between an anode and a cathode. The organic EL device is a luminescent device utilizing the light emission of the organic EL layer; that is, when a voltage is applied between the anode and the cathode, holes and electrons are injected into the organic EL layer from the anode and the cathode, respectively, and the energy generated by the recombination of holes and electrons excites the organic molecules, and in the course of deactivation of the excited organic molecules to the ground state, the organic molecules emit light.

The organic EL layer includes at least one layer out of three layers consisting of an organic layer called a luminescent layer which emits light by the recombination of holes and electrons, an organic layer called a hole transporting layer into which holes are easily injected but in which the movement of electrons is restricted, and an organic layer called an electron transporting layer to which electrons are easily injected but movement of holes is restricted.

Thin films for EL devices are generally formed by vacuum deposition. However, if water, acid, or alkali solutions are present, these materials will permeate the organic EL layer, the interface between the organic EL layer and the cathode, and the cathode, and these impurities will degrade the luminescent properties and the life of the organic EL device.

Three types of methods according to a rough classification are known for producing color display devices by the use of the organic EL devices.

The first type is a method of producing a color display device by the use of an organic EL device which emits white light and separately coated color filters for the three primary colors, red (R), green (G), and blue (B), for conversion of the white light into colored lights. This is the same system as that used in transmission-type color liquid crystal displays. This method is advantageous due to its simple structure, because it is possible to form color filters precisely by use of the photo-lithographic technique and because patterning of the organic layer is not necessary since the organic EL device emits white light uniformly. However, a problem is encountered in that the luminescence of the organic EL device is wasted, in other words, the efficiency of the white light from the organic EL device is low, since the majority of the white light emitted from the organic EL device is cut by the color filters. In addition, another problem is that it is necessary to develop an organic luminescent material which emits white light efficiently.

The second type is called a color conversion system using an organic EL device which emits blue light and a color conversion layer. For example, Japanese Patent Application, First Publication No. Hei 3-152897 discloses a color display system adopting the color conversion system. In this system, the blue light having a short wavelength is obtained from the organic EL device, and the green and red colors having longer wavelengths are obtained by the use of respective color conversion layers. This system is also advantageous in that a color display with a high image quality can be obtained comparatively easily because it is not necessary to form microstructure of the organic EL device and a precise color conversion layer can be formed by the photo-lithographic technique. However, a problem arises that the utilization efficiency of the luminescence of the organic EL device is low, because it is difficult to obtain a color conversion layer with high conversion efficiency. In addition, another problem arises, in that it is difficult to form a patterned transparent electrode without breakage of the electrode even if a flat surface is formed, because it is difficult to obtain flat patterned surfaces by a patterning operation of the color conversion layer.

In contrast to the first and second color systems having the above described problems, the third color display system, which enables efficient utilization of luminescence of organic EL devices, has been proposed to produce color systems by forming and arranging independently respective organic EL devices which respectively emit the respective three primary colors R, G, and B. A conventionally known method may be applied for forming independent organic EL devices in which patterning is performed by depositing deposits on the base plate through openings of a shadow mask such as a metal mask, which is disposed in between the base plate and an evaporation source. According to this system, the luminescence of individual organic EL devices can be utilized without loss, so that high conversion efficiency can be obtained. However, a major problem has been encountered in this system. The problem is that it is difficult to perform high precision patterning or patterning over a large area, because the wet etching process cannot used, and patterning can only be executed by the use of shadow masks such as metal masks.

SUMMARY OF THE INVENTION

In order to solve above problems, the present invention provides a means for realizing an organic EL color display device which is capable of exhibiting a high image quality and providing a large screen.

The present invention has the objective of realizing an organic EL color display device driven by the independent luminescent method of three primary colors. In order to coat luminescent organic layers separately with high dimensional precision, an organic EL transfer base plate is prepared by depositing a sublimable luminescent organic compound on a base film of the organic EL transfer base plate, and an organic EL transfer base plate and a transparent substrate provided with at least a transparent electrode are disposed in a vacuum deposition apparatus leaving a space therebetween, and the luminescent organic compound is deposited on said transparent substrate by locally heating the heat resistant base film of said organic EL transfer base plate.

Particularly, the heat resistant base film is constructed by a high heat conductivity member and the periphery of each section of the base film corresponding to a sub-pixel of the color organic EL device is surrounded by a low heat conductivity member, so that the high heat conductivity member allows local heating of the luminescent organic material located at the position corresponding to the sub-pixel and the low heat conductivity member suppresses the luminescent organic compound from being transferred to the adjacent pixels.

That is, the method of making an organic EL device comprises the steps of: arranging an organic EL transfer base plate, which is obtained by depositing a luminescent organic compound on one surface of a heat resistant film, and a transparent substrate provided with at least a transparent electrode, leaving a space therebetween; and transferring by sublimation said luminescent organic compound on said transparent substrate by a local heating the heat resistant base film of said organic EL transfer base plate.

By adopting such a method, it becomes possible to separately deposit the luminescent organic compound very precisely on the transparent substrate, which results in obtaining a high image quality. Since the transfer by sublimation makes deposition possible and does not necessarily require a vacuum deposition apparatus, it is possible to manufacture an organic EL display device with a large screen.

It is preferable that the above-described heat resistant base film is composed of a low heat conductivity member formed in a lattice structure and high heat conductivity members placed inside of said lattice structure.

It is also preferable to construct the heat resistant base film by alternately disposing and bonding bands of the low conductivity members and bands of the high conductivity members.

In addition, it is preferable that the luminescent organic compound adheres to said heat resistant base film by the vacuum deposition method.

PREFERRED EMBODIMENTS OF THE PRESENT INVENTION

Hereinafter, the present invention will be described in detail with reference to the attached drawings. However, it should be noted that the present invention is not limited to these embodiments.

Figure 1:
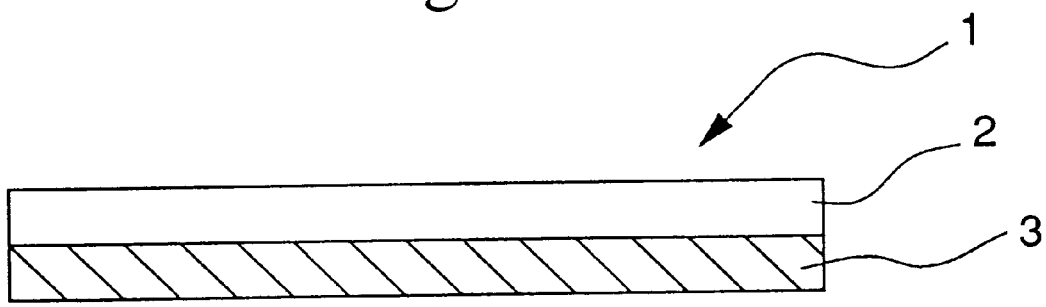
FIG. 1 is a cross sectional view showing an example of an organic EL transfer base plate.

FIG. 1 is a cross sectional view showing an example of an organic EL transfer base plate. This transfer base plate is made by vacuum deposition of a luminescent material 3 such as tris-(8-quinolinolate) aluminum complex (hereinafter called Alq3) at a thickness of 50 nm on a heat resistant base film 2 made of a copper plate with a thickness of 50 $\mu$m.

Figure 5:
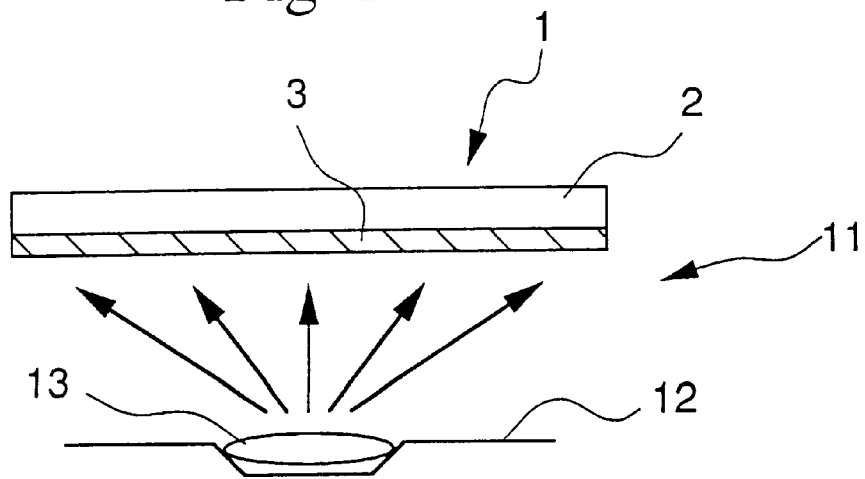
FIG. 5 is a schematic representation of the vacuum deposition apparatus.

As shown in FIG. 5, the copper base film 2 is set in the vacuum deposition apparatus 11, Alq3 is added as a deposition source 13 to a resistant heating boat 12, and a film of Alq3 is formed by applying a current to the resistant heating boat after evacuating the apparatus to less than $10^{-4}$ Pa. This organic EL transfer base plate 1 is used as the transfer base which emits the green light.

Similarly, another copper film with a thickness of 50 $\mu$m is prepared, and, on one hand, one resistant heating boat is filled with Alq3, and, on the other hand, another resistant heating boat is filled with 4-dicyanomethylene-2-methyl-6-(p-dimethylaminostyryl)-4H-pyran (hereinafter, called DCM) which is used as a dopant in Alq3, Both resistant heating boats are heated and co-deposited such that DCM is contained in the deposited film at 5 weight %. This transfer base plate is used as a base plate for the red light.

Similarly, another copper film with the same thickness is used for deposition of perylene at a thickness of 50 nm to form a transfer base plate for the blue light.

Figure 2:
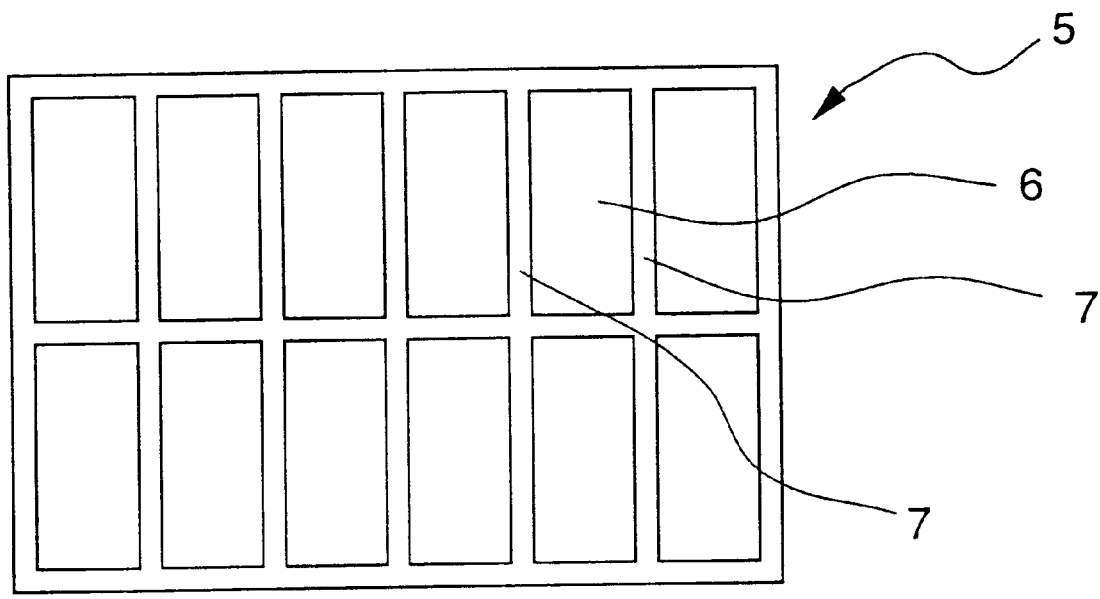
FIG. 2 is a plan view showing an example of a heat resistant film.
Figure 3:
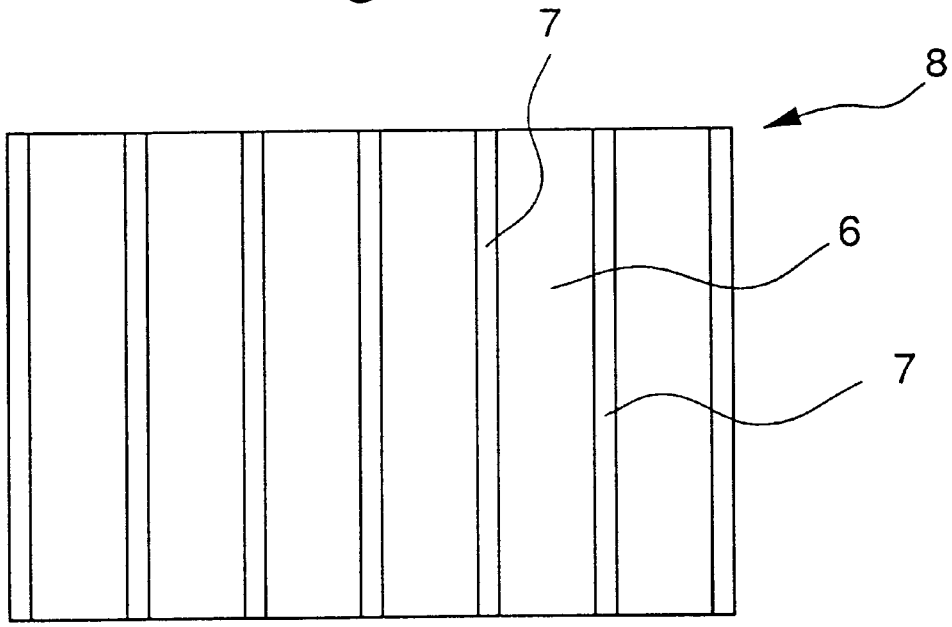
FIG. 3 is a plan view showing another example of the heat resistant film.

The other organic EL transfer base plates will now be explained. A copper plate with a thickness of 50 $\mu$m is placed on a stainless steel plate, and is covered with a negative working photosensitive dry film. Exposure is carried out by the use of a photo-mask having a pattern shown in FIG. 2, in which a high heat conductivity area 6 is shielded from the exposed light and then the negative working photosensitive film is developed. Subsequently, by use of a copper etching solution, the lattice-like portion which corresponds to low heat conductivity area 7 in FIG. 2 is removed, and the etched lattice-like potion is filled with a glass paste using the doctor-blade technique. After the glass paste is dried, the glass paste is melted by heating to around 600° C. in a reducing atmosphere. After annealing, the copper plate is separated from the stainless steel plate to form the heat resistant base film 5.

When a photo-mask having a tire fabric like pattern is used for producing the organic EL transfer base plate, a heat resistant base film 8, in which both sides of the copper band are bonded by glass stripes, can be produced.

Figure 4:
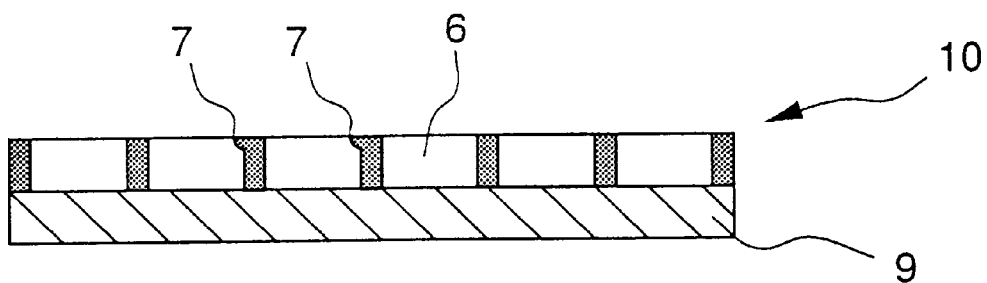
FIG. 4 is a cross sectional view of an organic EL transfer base plate.

The thus made heat resistant base film is put into the vacuum deposition apparatus, and a luminescent organic compound 9 is deposited on one surface of the heat resistant base film to form the organic EL transfer base plate 10. A cross sectional view of the organic EL transfer base plate 10 is shown in FIG. 4. Various luminescent organic compounds may be used such as Alq3, DCM doped Alq3, and perylene, which are described above.

Hereinafter, a method of manufacturing organic EL devices by the use of the above organic EL transfer base plate will be described.

Figure 6:
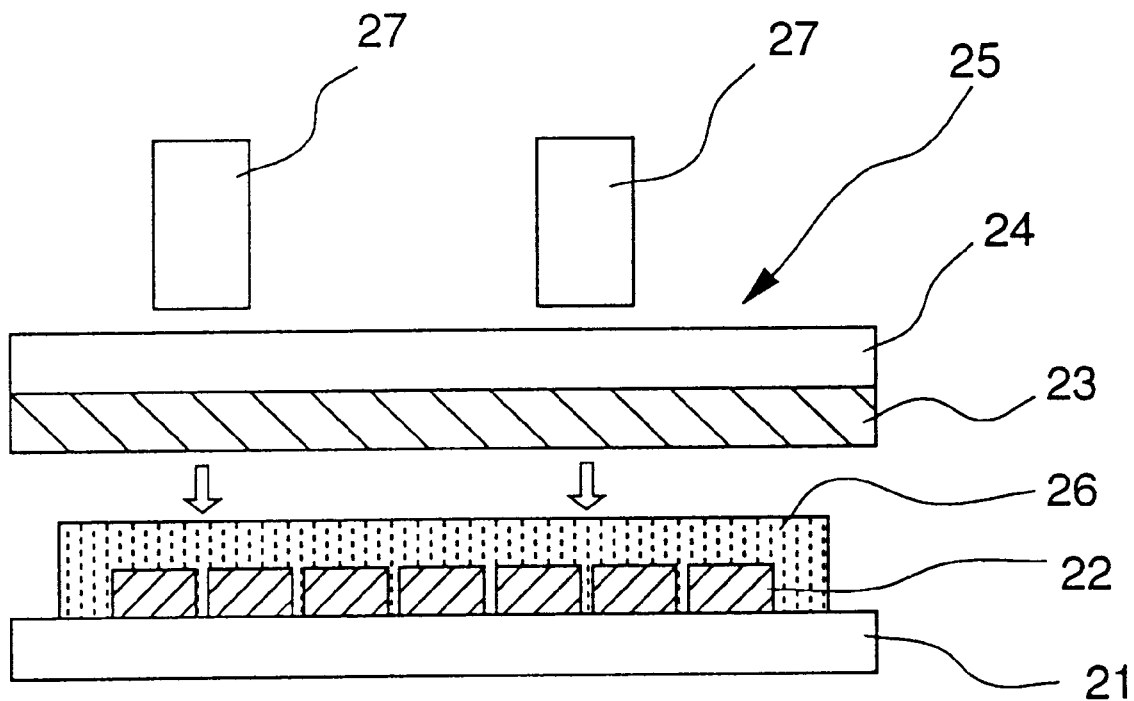
FIG. 6 is a cross sectional diagram showing an example of the transfer method of the organic EL transfer base plate.

As shown in FIG. 6, a transparent substrate 21 is prepared using a glass plate with a thickness of 1.1 mm, and a ITO (Indium Tin Oxide) film 22 with a thickness of 100 nm is deposited at the transparent substrate 21. It is preferable to use a non-alkali glass plate as the glass substrate, but low-alkali glass plates, or even soda-lime glass plates may be used, if careful pre-treatments such as sufficient drying of the glass plates are carried out. Subsequently, an anode is formed by patterning the ITO film 22 by a photolithographic technique in the form of strips along the longitudinal direction of the transparent substrate 21. Since the ITO film 22 is not only used as the anode, but is also used as the transparent display screen, together with the glass substrate, which outputs emitted light generated by the organic EL layer, it is preferable for the ITO film to have a low electric resistance and a high light transmittance. The number of stripes of the ITO film 22 is 384, wherein the properties of stripe lines are that the line pitch is 0.1 mm, the line width is 80 $\mu$m, and the line length is 25 mm.

The transparent substrate 21 is mounted, with the ITO film surface of the transparent substrate 21 facing downward, in a substrate holder of the vacuum deposition apparatus, and the resistant heating boat is filled with N,N'-diphenyl-N,N'-bis(α-naphtyl)-1,1'-biphenyl-4,4'-diamine (hereinafter called α-NPD). The vacuum deposition apparatus is evacuated by a vacuum pump to less than $1 \times 10^{-6}$ torr. Subsequently, a metal mask having a rectangular opening formed for depositing the organic EL layer is mounted under the substrate. The resistant heating boat containing α-NPD, which is placed at the lower part of the vacuum deposition apparatus below the substrate and the metal mask, is heated by applying a current. The α-NPD film 26 is deposited at a thickness of 50 nm.

The thus formed substrate is taken out of the vacuum deposition apparatus and is placed with the transparent substrate facing downward in an apparatus of a dry nitrogen gas atmosphere. Subsequently, the organic EL transfer base plate 25, formed of the heat resistant base film 24 with a coating of the luminescent organic compound 23 composed of Alq3 and a dopant of DCM, is arranged such that the surface of the organic luminescent compound 23 faces the α-NPD film 26 and such that both surfaces are spaced by approximately 0.5 mm from each other. At the same time, the ITO stripes formed by patterning on the transparent film 21 are aligned to face the high heat conductivity portions of the organic EL base plate 25 to each other.

By attaching a plurality of heat bars 27 to the organic EL transfer base plate from the side of the heat resistant film, the distance between the surface of the luminescent organic film 23 and the surface of the α-NPD 26 is brought closer to around 0.2 mm. The heat bars are heated to approximately 500° C. by applying a current. The organic luminescent compound 23 of the organic EL transfer base plate 25 is sublimated and transferred on the surface of the α-NPD layer 26.

The transparent substrate 21 and the organic EL transfer base plate 25 are shifted perpendicularly to the direction in which the ITO stripes extend and the ITO pattern and the high heat conductivity portions are re-aligned. The same operations are successively conducted until the organic compound 23 is transferred on the α-NPD layer on every two stripes of the ITO 22 on the transparent substrate 21.

Subsequently, the organic EL transfer base plate is replaced with that having a deposited layer of Alq3. By aligning the ITO stripes next to the ITO stripes which are already coated by the organic compound by the previous transfer operation, Alq3 is transferred by the same operation as described above. The same operations are repeatedly executed after replacing the organic EL transfer base plate with perylene. Thereby, a transparent substrate 21 is obtained on which three-color organic compounds are transferred in sequence.

The transparent substrate, on which organic three-color luminescent compounds are formed, is mounted in the vacuum deposition apparatus with the glass plate side facing upward. The resistant heating boat in the vacuum deposition apparatus is filled with Alq3, and the apparatus is evacuated to less than $1 \times 10^{-6}$ torr. Subsequently, a metal mask with a rectangular opening to mask the area for depositing the organic EL layer is arranged under the substrate and the resistant heating boat containing Alq3 disposed below the substrate and the mask is heated by applying a current, and the Alq3 layer, which plays a role as an electron transporting layer, is deposited at a thickness of 25 nm.

Figure 7:
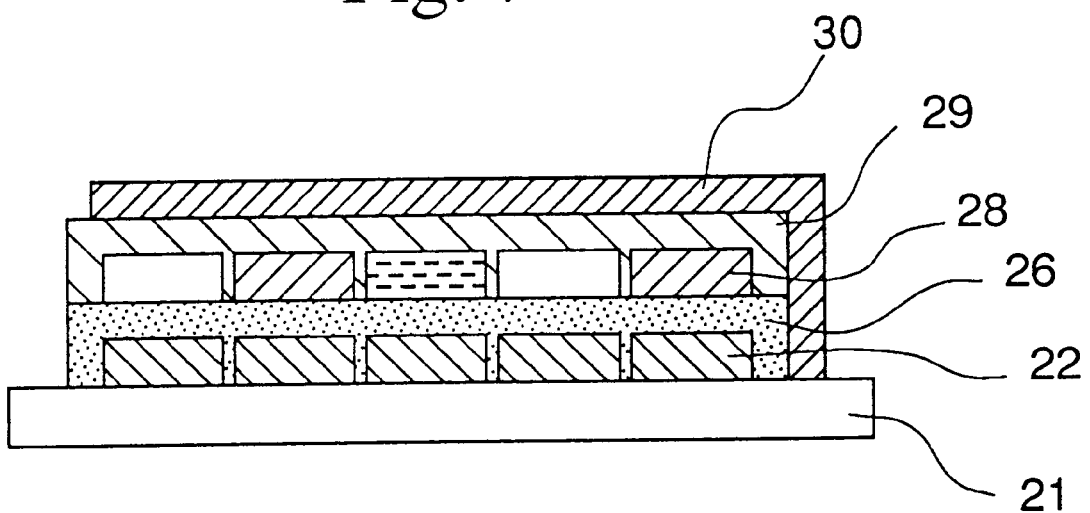
FIG. 7 is a cross sectional diagram showing an example of the organic EL device.

Subsequently, a shadow mask made of SUS 430 is disposed in the vacuum deposition apparatus, and magnesium is put into a resistant heating boat located at a position to allow deposition through the shadow mask, and silver is put into another resistant heating boat. A film is deposited until the thickness reaches 200 nm at a deposition speed in which the ratio of magnesium to silver is 10:1. Sixty four slits of 0.25 mm in width and 45 mm in length are formed in the shadow mask at a pitch of 0.3 mm. Thus, a cathode 30 provided with 64 stripes made of the mixed metal of magnesium and silver is formed on the organic EL layer, and the organic EL device shown in FIG. 7 is obtained.

The method of heating the organic EL transfer base plate is not limited to the heat bars, and a near infra-red laser and a YAG laser may be used. In addition, glass fiber reinforced plastics and heat resistant plastics such as polyimide may be used other than glass or alumina as a material for the low thermal conductivity portion.

Hereinafter, the operation of the organic EL device according to the first embodiment will be described.

When a voltage from an outside electric circuit is applied to the organic EL device between the anode of the ITO 22 formed by patterning on the transparent substrate 21 and the cathode formed by the mixed metal 30 of magnesium and silver, holes are injected from the cathode to the hole transporting layers 26 such as the α-NPD layer and the luminescent organic compound 28, and electrons are injected from the anode to the electron transporting layers 29 such as the Alq3 layer and the luminescent organic layer 28. The recombination of holes and electrons occurs in the luminescent organic compound 28, which results in the emission of light.

No particular patterning process is necessary for the hole transporting layer 26 and electron transporting layer 29 if a material which is common to the three primary colors is selected. According to the present invention, the organic luminescent compounds for three primary colors are deposited on the base film in advance, and finely separated organic luminescent layers are formed by the sublimation transfer method using the heating means such as heat bars.

A section, the size of which is the same as that of a pixel to be formed in the organic EL device, is formed by copper or silver, and, after the periphery or both sides of the section are surrounded by the low thermal conductivity materials such as glass or alumina, the luminescent organic compound is deposited on the thus formed section. When the section with the film of the luminescent organic compound is arranged above each pixel, and when the section is heated by, for example, a heating means such as the heat bars, the applied heat is conducted in the high conductivity section to sublimate the organic compound for depositing it on desired pixel portions of the EL device, and deposition of the organic compound onto the unnecessary parts of the EL device can be suppressed by the low thermal conductive materials.

Hereinafter, the second embodiment of the organic EL device using the organic EL transfer base plate is described.

Figure 8:
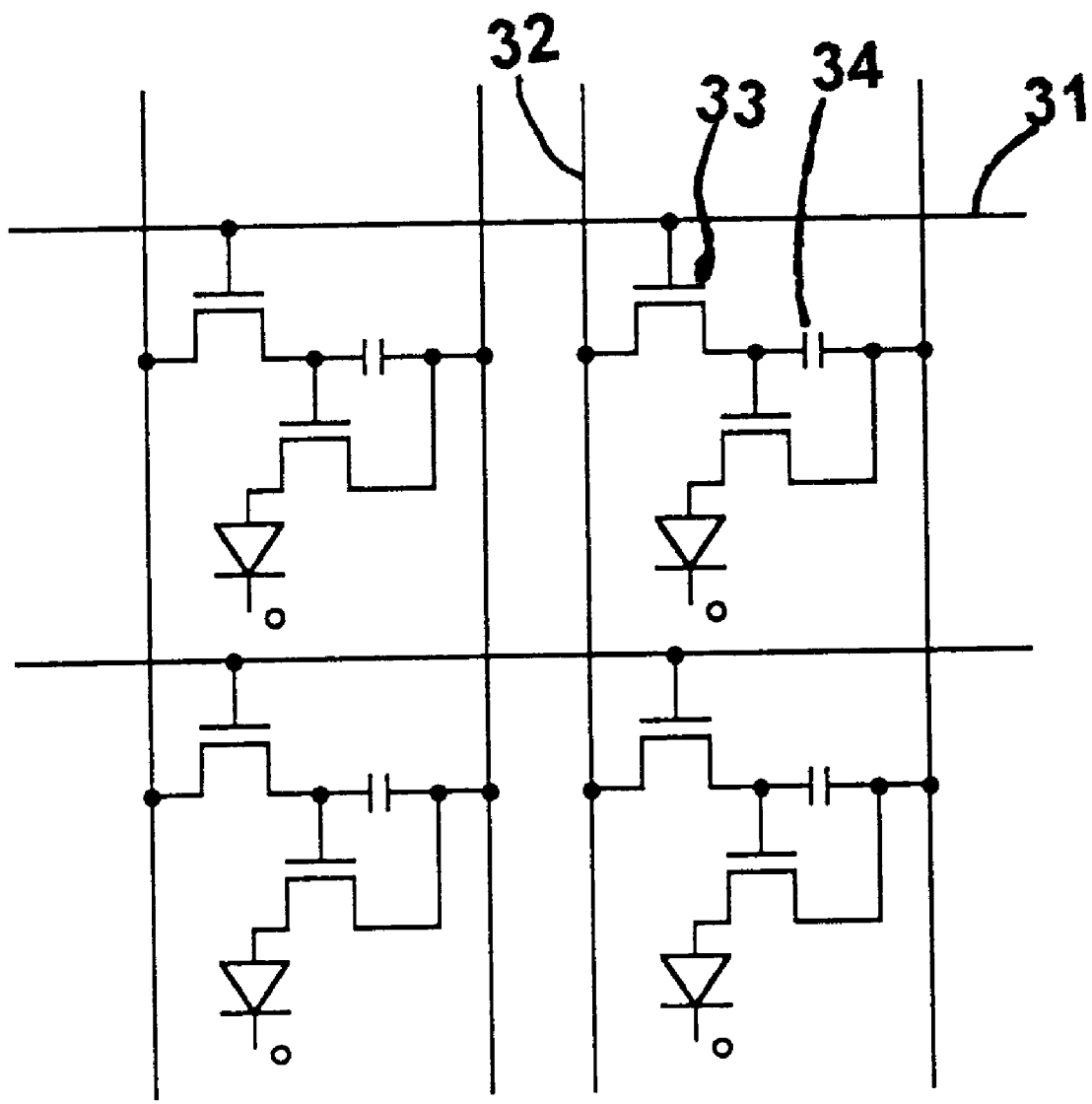
FIG. 8 shows a plan view of a transparent substrate provided with switching transistors for exerting active driving of pixels of the organic EL device.

FIG. 8 shows a plan view of a transparent substrate provided with switching transistors for exerting active driving of pixels of the organic EL device. When driving signals are input from data lines 32 while gate lines 31 are electrically scanning, a transistor 33 is switched on and a capacitor 34 is charged. The electrical current flowing through the transistor 33 as well as the electrical current flowing through the organic EL device are determined by the charge of the capacitor. In this embodiment, in contrast to the first embodiment, the cathode of the organic EL device does not have to be formed into stripes by patterning, and the cathode can be a common electrode. Therefore, in this embodiment, any layer of the organic EL device except the ITO layer does not have to be patterned. Moreover, the luminescent layer of the organic EL device can be separately formed by the sublimation transfer method by use of organic EL transfer base plates.

It should be noted that the scope of the present invention is not limited to the above embodiment and various modifications may be added within a scope not departing from the gist of the present invention.

As hereinabove described in detail, the method of producing the organic EL device contributes to the production of color organic EL devices which enables realization of a high image quality and large display screens, by the use of the steps of making in advance the organic EL transfer base plates by depositing the sublimating luminescent organic compounds on the base film, transferring from the organic EL transfer base plates the luminescent organic compounds to the transparent substrate having the transparent electrode made of the ITO stripes by patterning processing.

The base film of the orgnic EL transfer base plate is heat resistant and is constructed of a highly heat conductivity member, and the periphery of each section corresponding to a subpixel of the color organic EL device is surrounded by the low heat conductivity member. The thus constructed base film makes it possible to deposit the luminescent organic compound on only the area corresponding to the pixel by local heating of the luminescent organic film on the conductive base film and not to deposit it on areas where it is unnecessary by suppressing heating due to the low heat conductive member.

What is claimed is:

1. A method of forming an organic EL device comprising the steps of:

forming an organic EL transfer base plate, by depositing a luminescent organic compound on one surface of a heat resistant film said heat resistive film having a first heat conductivity area and a second heat conductivity area, wherein said first heat conductivity area has a higher heat conductivity than said second heat conductivity area, providing a transparent substrate having at least a transparent electrode formed on said transparent substrate, wherein said transparent substrate is spaced from said organic EL transfer base plate; and transferring by sublimation said luminescent organic compound on said transparent substrate by locally heating said heat resistant base film of said organic EL transfer base plate.

2. A method of making an organic EL device according to claim 1, wherein said second heat conductivity area is formed in a lattice structure and said first heat conductivity area is inside said lattice structure.

3. A method of making an organic EL device according to claim 1, wherein said heat resistant base film is constructed by alternately disposing the second conductivity members in the form of bands and the first conductivity members in the form of bands.

4. A method of making an organic EL device according to claim 1, wherein the luminescent organic compound is adhered on said heat resistant base film by vacuum deposition.

* * * * *